(12) United States Patent  
Makihara et al.

(10) Patent No.: US 8,653,518 B2  
(45) Date of Patent: Feb. 18, 2014

(54) SEMICONDUCTOR DEVICE

(75) Inventors: Katsunori Makihara, Higashihiroshima (JP); Seiichi Miyazaki, Higashihiroshima (JP); Seiichiro Higashi, Higashihiroshima (JP); Hideki Murakami, Higashihiroshima (JP)

(73) Assignee: Hiroshima University, Higashihiroshima-Shi, Hiroshima (JP)

( * ) Notice: Subject to any disclaimer, the term of this patent is extended or adjusted under 35 U.S.C. 154(b) by 443 days.

(21) Appl. No.: 12/599,638

(22) PCT Filed: Dec. 6, 2007

(86) PCT No.: PCT/JP2007/001360  
§ 371 (c)(1),  
(2), (4) Date: Nov. 10, 2009

(87) PCT Pub. No.: WO2008/142739  
PCT Pub. Date: Nov. 27, 2008

(65) Prior Publication Data  
US 2010/0308328 A1 Dec. 9, 2010

(30) Foreign Application Priority Data  
May 16, 2007 (JP) .................. 2007-131078

(51) Int. Cl.  
*H01L 29/792* (2006.01)  
*H01L 29/02* (2006.01)

(52) U.S. Cl.  
USPC 257/48; 257/325; 257/E29.002; 257/E29.309

(58) Field of Classification Search  
None  
See application file for complete search history.

(56) References Cited

U.S. PATENT DOCUMENTS

| 4,785,186 | A | * | 11/1988 | Street et al. | 250/370.14 |
| 4,855,950 | A | * | 8/1989 | Takada | 365/113 |
| 4,900,691 | A | * | 2/1990 | Jun | 438/96 |
| 5,148,242 | A | * | 9/1992 | Tsukaka et al. | 257/24 |
| 5,164,809 | A | * | 11/1992 | Street et al. | 257/55 |

(Continued)

FOREIGN PATENT DOCUMENTS

| JP | 2000-040753 | 2/2000 |
| JP | 2000-091451 | 3/2000 |

(Continued)

OTHER PUBLICATIONS

International Search Report of International Application No. PCT/JP2007/001360 and English translation of the same, mail date Mar. 4, 2008, 4 pages.

(Continued)

*Primary Examiner* — Hrayr A Sayadian  
(74) *Attorney, Agent, or Firm* — Foley & Lardner LLP

(57) ABSTRACT

A semiconductor device has a floating gate structure in which charge storage layers are stacked on a $SiO_2$ layer formed on a substrate made of n-type Si. The charge storage layer has quantum dots made of undoped Si and an oxide layer that covers the quantum dots. The charge storage layer has quantum dots made of $n^+$-Si and an oxide layer that covers the quantum dots. Electrons originally existing in the quantum dots migrate between the quantum dots and the quantum dots via tunnel junction and are distributed in the quantum dots and/or the quantum dots according to the voltage applied to a gate electrode via pads. The distribution is detected in the form of a current ($I_{SD}$).

20 Claims, 8 Drawing Sheets

(56) References Cited

U.S. PATENT DOCUMENTS

| | | | |
|---|---|---|---|
| 5,905,273 A * | 5/1999 | Hase et al. ................. 257/24 |
| 5,952,692 A | 9/1999 | Nakazato et al. |
| 6,060,743 A | 5/2000 | Sugiyama et al. |
| 6,118,686 A * | 9/2000 | Taira et al. ................. 365/129 |
| 6,208,000 B1 | 3/2001 | Tanamoto et al. |
| 6,239,449 B1 * | 5/2001 | Fafard et al. ................. 257/17 |
| 6,333,214 B1 | 12/2001 | Kim et al. |
| 6,946,346 B2 | 9/2005 | Chae et al. |
| 7,250,653 B2 | 7/2007 | Kim et al. |
| 7,393,745 B2 | 7/2008 | Jeng |
| 7,405,423 B2 | 7/2008 | Tanamoto et al. |
| 7,602,011 B2 | 10/2009 | Sugizaki |
| 2001/0028055 A1 * | 10/2001 | Fafard et al. ................. 257/17 |
| 2003/0042534 A1 | 3/2003 | Bhattacharyya |
| 2004/0004223 A1 * | 1/2004 | Nagahama et al. ........... 257/74 |
| 2004/0108512 A1 | 6/2004 | Iwata et al. |
| 2005/0045943 A1 | 3/2005 | Lung et al. |
| 2005/0122775 A1 | 6/2005 | Koyanagi et al. |
| 2005/0127431 A1 | 6/2005 | Chang et al. |
| 2010/0155808 A1 * | 6/2010 | Makihara et al. ............ 257/316 |
| 2012/0061746 A1 * | 3/2012 | Ohba ........................... 257/325 |

FOREIGN PATENT DOCUMENTS

| | | |
|---|---|---|
| JP | 2000-150862 | 5/2000 |
| JP | 2000-164735 | 6/2000 |
| JP | 2001-313386 | 11/2001 |
| JP | 2002-076358 | 3/2002 |
| JP | 2003-078050 | 3/2003 |
| JP | 2003-258240 | 9/2003 |
| JP | 2003-347434 | 12/2003 |
| JP | 2004-259986 | 9/2004 |
| JP | 2005-079186 | 3/2005 |
| JP | 2005-268531 | 9/2005 |
| JP | 2005-277263 | 10/2005 |
| JP | 2009-260611 | 11/2009 |

OTHER PUBLICATIONS

Ohba et al., Nonvolatile Si Quantum Memory With Self-Aligned Doubly-Stacked Dots, IEEE Transactions on Electron Devices, Aug. 2002, pp. 1392-1398, vol. 49, No. 8.

Fujitsu, "Light operation and write operation is successful multi-level charge of controlling the number of new quantum dot memory," Oct. 10, 2000, http://pr.fujitsu.com/jp/news/2000/10/10-1.html, 4 pages (machine translation).

Darma, Y. et al., "Influence of thermal annealing on compositional mixing and crystallinity of highly selective grown Si dots with Ge core," Applied Surface Science, vol. 224, 2004, pp. 156-159.

International Search Report and Written Opinion for PCT/JP2007/001361 mailed on Mar. 11, 2008, 11 pages.

Notice of Reasons for Rejection for JP 2007-236635 mailed Jul. 13, 2010 (with English translation).

US Notice of Allowance for U.S. Appl. No. 12/523,682 DTD Nov. 26, 2010.

Lee, J.J. et al., "Theoretical and Experimental Investigation of Si Nanocrystal Memory Device with HfO2 High-k Tunneling Dielectric," Symposium on VLSI Technology Digest of Technical Papers, Jun. 10-12, 2003, pp. 33-34.

Makihara, K. et al., "Characterization of Electronic Charged States of Impurity Doped Si Quantum Dots Using AFM/Kelvin Probe Technique," Abstract of IUMRS-ICA, 2006, p. 82.

Makihara, K. et al., "Fabrication of Multiply-Stacked Structures of Si Quantum-Dots Embedded in SiO2 by Combination of Low-Pressure CVD and Remote Plasma Treatments," International Microprocesses and Nanotechnology Conference, Digest of Papers, Oct. 27, 2004, pp. 216-217.

* cited by examiner

SEMICONDUCTOR DEVICE

CROSS-REFERENCE TO RELATED PATENT APPLICATIONS

The present application claims priority as a national stage application of the International Application No. PCT/JP2007/001360 filed on Dec. 6, 2007, which claims the benefit of priority to Japanese Application No. 2007-131078, filed May 16, 2007, the entire contents of which are incorporate herein by reference in their entireties.

TECHNICAL FIELD

The present invention relates to a semiconductor device. In particular, it relates to a semiconductor device that has a composite floating gate structure.

BACKGROUND ART

A known conventional information processing structure is described in Japanese Patent Laid-Open No. 2001-313386. The conventional information processing structure has quantum dots formed directly above the gate electrode of a metal oxide semiconductor field effect transistor (MOSFET), first and second information electrodes formed on the both sides of the quantum dots in an in-plane direction of the substrate in which the MOSFET is formed and a power supply electrode formed above the quantum dots.

The quantum dots are coupled to the gate electrode of the MOSFET and the power supply electrode by tunnel junction. In addition, each quantum dot is capacitively coupled to a corresponding one of the first information electrodes and a corresponding one of the second information electrodes.

In the conventional information processing structure, according to the potential of the first and second information electrodes, electrons migrate between the power supply electrode and the gate electrode via the quantum dots because of coulomb blockade. As a result, the potential of the capacitor formed between the information processing structure and the substrate varies.

Therefore, the conventional information processing structure compares the voltages applied to the first and second information electrodes by detecting the potential of the capacitor that varies with the potential of the two information electrodes.

DISCLOSURE OF THE INVENTION

However, the conventional information processing structure has a problem that a high driving voltage is required because carriers are externally supplied to the quantum dots.

The present invention is devised to solve the problem, and an object of the present invention is to provide a semiconductor device that has a floating gate structure and can reduce the driving voltage.

A semiconductor device according to the present invention is a semiconductor device having a floating gate structure and comprises a plurality of charge storage layers and a gate electrode. The plurality of charge storage layers are stacked on a substrate and each contain quantum dots. The gate electrode applies a voltage to the plurality of charge storage layers. The quantum dots in one of the plurality of charge storage layers have a higher carrier concentration than the quantum dots in the other charge storage layer. Two quantum dots in adjacent two charge storage layers are coupled to each other by tunnel junction.

Preferably, the plurality of charge storage layers includes first and second charge storage layers and an insulating layer. The first charge storage layer contains first quantum dots having a first carrier concentration. The second charge storage layer contains second quantum dots having a carrier concentration lower than the first carrier concentration. The insulating layer provides tunnel junction between the first quantum dots and the second quantum dots. The gate electrode is formed on the first charge storage layer in such a manner that the gate electrode is capacitively coupled to the first quantum dots.

Preferably, the first quantum dots are made of a semiconductor material with a p-type or n-type conductive type, and the second quantum dots are made of a semiconductor material with an intrinsic conductive type.

Preferably, the first quantum dots are made of n-type silicon, and the second quantum dots are made of undoped silicon.

Preferably, the semiconductor device further comprises a detecting section. The detecting section detects the result of comparison between first and second voltages applied to the first and second charge storage layers via the gate electrode in the form of a current that flows according to the carrier distribution of the first and second quantum dots. The gate electrode includes a first gate electrode and a second gate electrode. The first gate electrode applies the first voltage to the first and second charge storage layers. The second gate electrode applies the second voltage to be compared with the first voltage to the first and second charge storage layers. The first and second quantum dots have carriers whose distribution is associated with the comparison results between the first and second voltages.

Preferably, the carriers are distributed only in the first quantum dots when the first and second voltages represent a first logic level, the carriers are distributed in the first and second quantum dots when one of the first and second voltages represents the first logic level, and the other of the first and second voltages represents a second logic level that differs from the first logic level and the carriers are distributed only in the second quantum dots when the first and second voltages represent the second logic level.

Preferably, the semiconductor device further comprises a dielectric layer. The dielectric layer provides capacitive coupling between the gate electrode and the first quantum dots. The first gate electrode is formed in contact with the dielectric layer at a position on one side of the center of the substrate in an in-plane direction of the substrate, and the second gate electrode is formed in contact with the dielectric layer at a position on the other side of the center of the substrate in the in-plane direction of the substrate. The carriers are distributed in the first quantum dots formed below the first gate electrode and the second quantum dots formed below the second gate electrode when the first voltage represents the first logic level and the second voltage represents the second logic level, and the carriers are distributed in the second quantum dots formed below the first gate electrode and the first quantum dots formed below the second gate electrode when the first voltage represents the second logic level, and the second voltage represents the first logic level.

Preferably, the first and second charge storage layers and the gate electrode are disposed on a channel region of a field effect transistor formed in one principal surface of the substrate. The detecting section detects the result of comparison between the first and second voltages in the form of a current that flows between a source and a drain of the field effect transistor.

Preferably, the detecting section detects a first current when the first and second voltages represent the first logic level, detects a second current lower than the first current when the first voltage represents the first logic level and the second voltage represents the second logic level, detects a third current lower than the second current when the first voltage represents the second logic level and the second voltage represents the first logic level, and detects a fourth current lower than the third current when the first and second voltages represent the second logic level.

In the semiconductor device according to the present invention, when a voltage is applied to the plurality of charge storage layers via the gate electrodes, carriers supplied from quantum dots having a higher carrier density migrate between the quantum dots in the plurality of charge storage layers and are distributed in the plurality of quantum dots in the plurality of charge storage layers according to the applied voltage. The carrier distribution of the plurality of quantum dots in the plurality of charge storage layers can represent a stored numeric value or the comparison results between two voltages applied to the gate electrodes.

Therefore, according to the present invention, the driving voltage of the semiconductor device used as a semiconductor memory or comparator can be reduced.

BEST MODE FOR CARRYING OUT THE INVENTION

Figure 1:
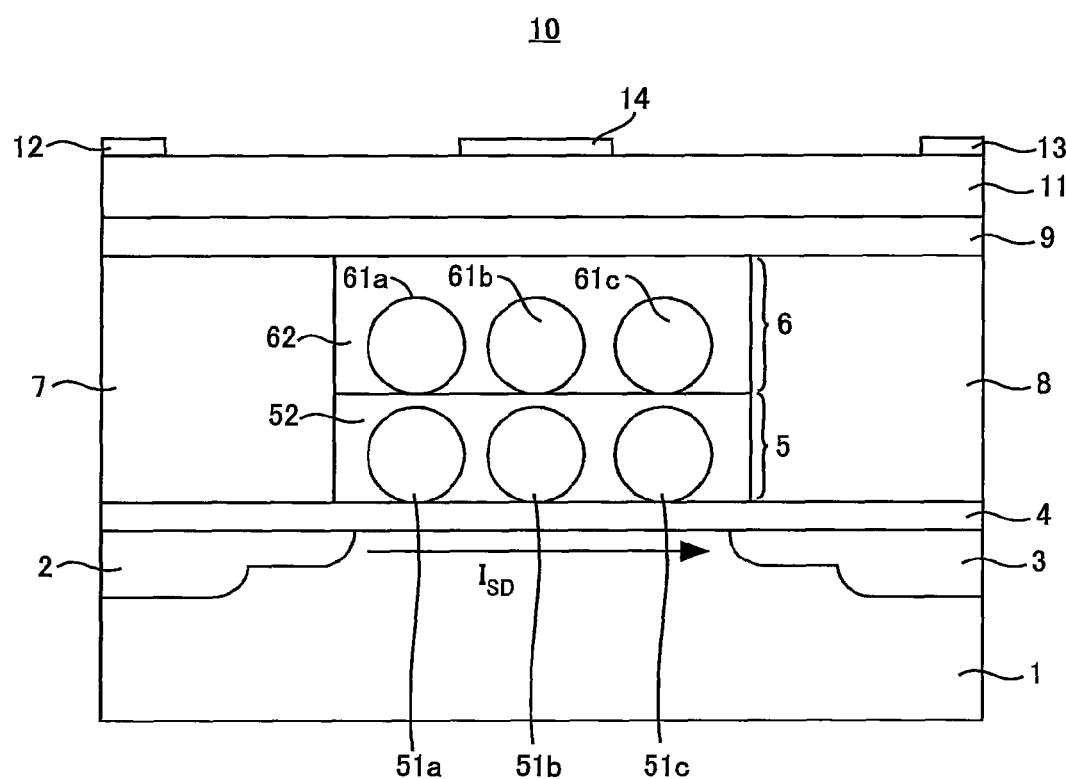
FIG. 1 is a cross-sectional view of a semiconductor device according to an embodiment of the present invention.

An embodiment of the present invention will be described in detail with reference to the drawings. The same or equivalent parts are denoted by the same reference numerals throughout the drawings, and redundant descriptions thereof will be omitted.

FIG. 1 is a cross-sectional view of a semiconductor device according to an embodiment of the present invention. Referring to FIG. 1, a semiconductor device 10 according to an embodiment of the present invention has a substrate 1, a source electrode 2, a drain electrode 3, $SiO_2$ layers 4 and 11, charge storage layers 5 and 6, side walls 7 and 8, gate electrodes 9 and 14, and pads 12 and 13.

The substrate 1 is made of n-type silicon (Si) with a (100) face, for example. The source electrode 2 and the drain electrode 3 are made of $p^+$-Si and are formed on one principal surface side of the substrate 1. The $SiO_2$ layer 4 is formed on the principal surface of the substrate 1 and has a thickness that does not allow tunneling of electrons. That is, the $SiO_2$ layer 4 has a thickness that provides capacitive coupling of the charge storage layer 5 and the substrate 1.

The charge storage layer 5 is formed on the $SiO_2$ layer 4 in contact with the $SiO_2$ layer 4. The charge storage layer 6 is formed on the charge storage layer 5 in contact with the charge storage layer 5. The side wall 7 is made of an insulator, such as a $SiO_2$ film, and is formed in contact with one side surface of the charge storage layers 5 and 6 and the $SiO_2$ layer 4. The side wall 8 is made of an insulator, such as a $SiO_2$ film, and is formed in contact with the other side surface of the charge storage layers 5 and 6 and the $SiO_2$ layer 4. The side walls 7 and 8 have a thickness approximately equal to the total thickness of the charge storage layers 5 and 6.

The gate electrode 9 is made of a metal silicide such as nickel silicide, a metal nitride such as titanium nitride (TiN), a metal carbide, or a germanide, for example, and is formed on the charge storage layer 6 and the side walls 7 and 8 in contact with the charge storage layer 6 and the side walls 7 and 8. The $SiO_2$ layer 11 is formed to cover the gate electrode 9 and has a thickness that does not allow tunneling of electrons.

The pad 12 is positioned above one end of the gate electrode 9 and is formed in contact with the $SiO_2$ layer 11. The pad 13 is positioned above the other end of the gate electrode 9 and is formed in contact with the $SiO_2$ layer 11. The pads 12 and 13 are capacitively coupled to one end and the other end of the gate electrode 9, respectively.

The gate electrode 14 is formed on the $SiO_2$ layer 11 in contact with the $SiO_2$ layer 11. The gate electrode 14 is made of a pure metal such as tantalum (Ta), aluminum (Al), tungsten (W) and molybdenum (Mo), an alloy thereof, a metal silicide nitride such as titanium nitride (TiN) and tantalum nitride (TaN), a stack structure of TiN/W/TiN, a transparent conductor such as indium tin oxide (ITO) and indium zinc oxide (IZO), or a semiconductor doped with a high concentration of impurities to have a reduced resistance.

The charge storage layer 5 comprises quantum dots $51a$ to $51c$ and an oxide layer 52. Each of the quantum dots $51a$ to $51c$ is made of undoped Si and is formed in contact with the $SiO_2$ layer 4. The dot density of the quantum dots $51a$ to $51c$ ranges from $5 \times 10^{10}$ cm$^{-2}$ to $1 \times 10^{13}$ cm$^{-2}$. The oxide layer 52 is made of $SiO_2$ and is formed on the $SiO_2$ layer 4 to cover the quantum dots $51a$ to $51c$.

The charge storage layer 6 comprises quantum dots $61a$ to $61c$ and an oxide layer 62. Each of the quantum dots $61a$ to $61c$ is made of n'-Si and is formed on the oxide layer 52. The quantum dots $61a$ to $61c$ are positioned above the quantum dots $51a$ to $51c$, respectively. The dot density of the quantum dots $61a$ to $61c$ ranges from $5 \times 10^{10}$ cm$^{-2}$ to $1 \times 10^{13}$ cm$^{-2}$, and the carrier concentration ranges from 1 to 100 carriers per dot.

The term "quantum dot" means a quantum structure of a conductor material and is a spherical or semispherical microcrystal composed of a semiconductor single crystal having a small enough size that injection of one carrier into the dot increases the electrostatic energy of the dot by an amount greater than 26 meV, which is the energy at room temperature. In the case where the quantum dot is made of Si, the quantum dot typically has a size of 10 nm or less.

Therefore, each of the quantum dots $51a$ to $51c$ and $61a$ to $61c$ is composed of a spherical or semispherical microcrystal having a size of 10 nm or less.

The oxide layer 52 covering the quantum dots $51a$ to $51c$ has a thickness that provides a distance of about 1 to 3 nm between the quantum dots $51a$ and $61a$, between the quantum dots $51b$ and $61b$ and between the quantum dots $51c$ and $61c$.

That is, the oxide layer 52 has a thickness that allows tunneling of electrons between the quantum dots 51a and 61a, between the quantum dots 51b and 61b and between the quantum dots 51c and 61c.

On the other hand, the oxide layer 62 covering the quantum dots 61a to 61c has a thickness of 3 to 6 nm, which does not allow tunneling of electrons between the gate electrode 9 and the quantum dots 61a to 61c. That is, the oxide layer 62 has a thickness that provides capacitive coupling between the gate electrode 9 and the quantum dots 61a to 61c.

As described above, the semiconductor device 10 has the charge storage layers 5 and 6 that are interposed between the $SiO_2$ layer 4 that provide capacitive coupling between the quantum dots 51a to 51c and the substrate 1 and the $SiO_2$ layer 11 that provides capacitive coupling between the quantum dots 61a to 61c and the gate electrode 14. Thus, the semiconductor device 10 has a floating gate structure formed on a MOSFET.

For the semiconductor device 10, the number of quantum dots 51a to 51c and 61a to 61c on the channel is inevitably determined by the size and density of the quantum dots 51a to 51c and 61a to 61c, regardless of the channel length and channel width of the MOSFET.

Figure 2:
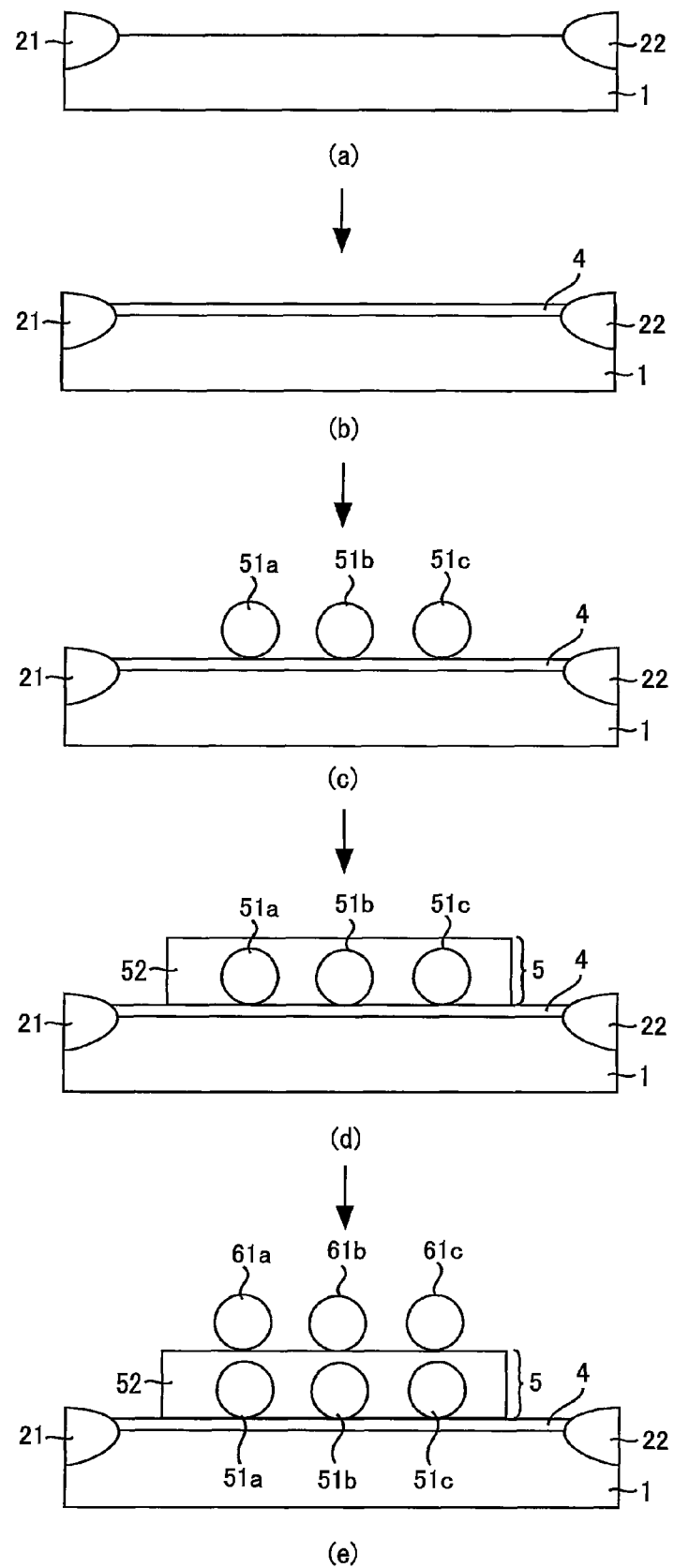
FIG. 2 is a first process diagram showing a method of manufacturing the semiconductor device shown in FIG. 1.
Figure 3:
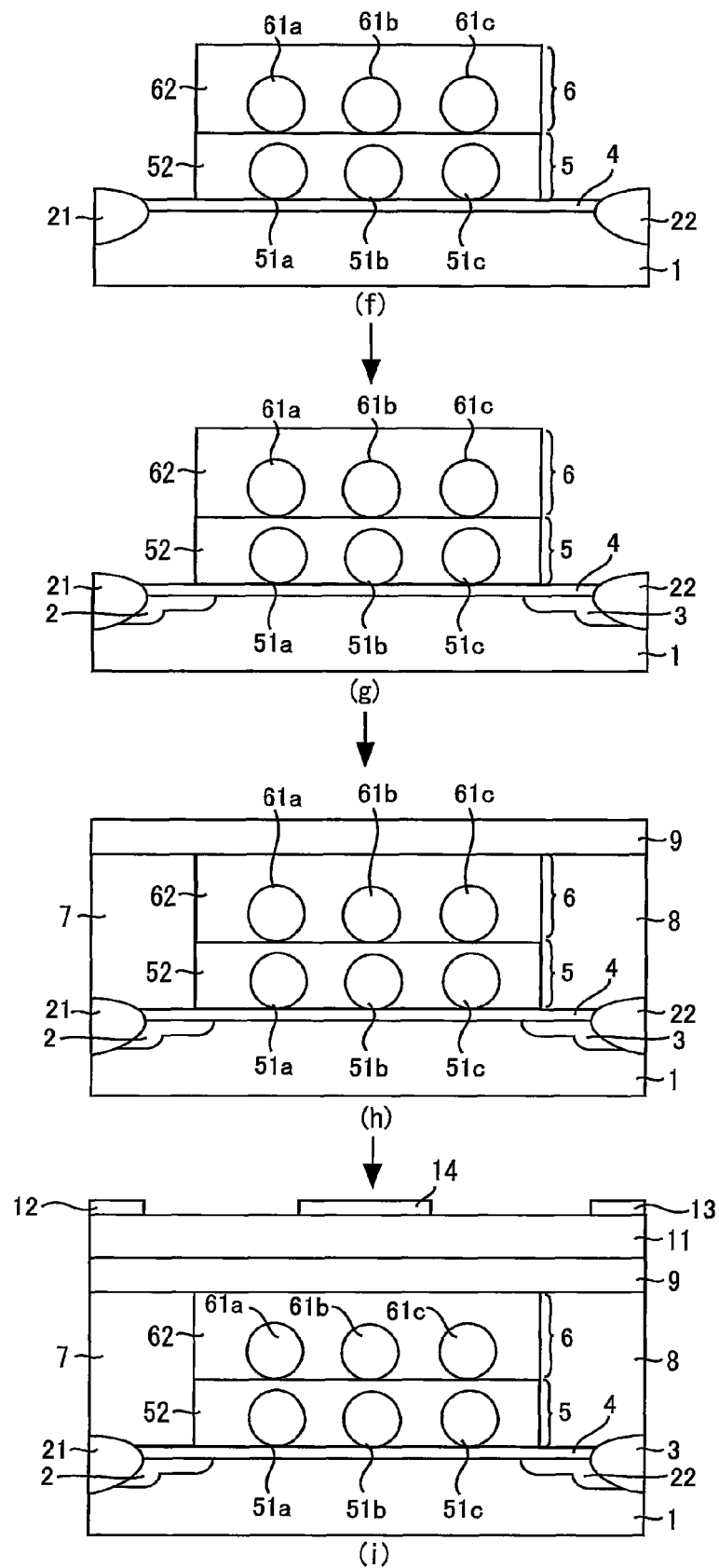
FIG. 3 is a second process diagram showing the method of manufacturing the semiconductor device shown in FIG. 1.

Next, a method of manufacturing the semiconductor device 10 will be described. FIGS. 2 and 3 are a first and a second process diagram showing a method of manufacturing the semiconductor device 10 shown in FIG. 1. Referring to FIG. 2, at the beginning of the process, oxide regions 21 and 22 are selectively formed in the top surface of the substrate 1 by local oxidation of silicon (LOCOS) (see the part (a) of FIG. 2).

Then, one principal surface of the substrate 1 is oxidized in a 2%-oxygen atmosphere at about 1000 degrees C. to form a $SiO_2$ film over the principal surface of the substrate 1, and the resulting $SiO_2$ film is patterned by lithography to form the $SiO_2$ layer 4 (see the part (b) of FIG. 2).

Then, the surface of the $SiO_2$ layer 4 is cleaned with 0.1% hydrofluoric acid. Thus, the surface of the $SiO_2$ layer 4 is terminated with OH. Then, the quantum dots 51a to 51c are formed on the $SiO_2$ layer 4 in a self-organizing manner by low pressure chemical vapour deposition (LPCVD) at a substrate temperature of 575 degrees C. under a reaction pressure of 26.6 Pa for 60 seconds using silane ($SiH_4$) gas as a raw material (see the part (c) of FIG. 2).

Then, the quantum dots 51a to 51c are oxidized in a 2%-oxygen atmosphere at about 850 degrees C. to form the oxide layer 52 having a thickness of about 2 nm. In this way, the charge storage layer 5 is formed (see the part (d) of FIG. 2).

Then, the quantum dots 61a to 61c are formed on the oxide layer 52 in a self-organizing manner by LPCVD at a substrate temperature of 575 degrees C. under a reaction pressure of 26.6 Pa for 60 seconds using $SiH_4$ gas and phosphine ($PH_3$) gas as a raw material (see the part (e) of FIG. 2).

Then, amorphous silicon (a-Si) is deposited on the quantum dots 61a to 61c. In this case, disilane ($Si_2H_6$) gas is used as a raw material gas, and the substrate temperature is 440 degrees C., and the reaction pressure is 26.6 Pa. Then, the a-Si is oxidized in a 2%-oxygen atmosphere at 1000 degrees C. to form the oxide layer 62 having a thickness of about 3 to 6 nm. In this way, the charge storage layer 6 is formed (see the part (f) of FIG. 3).

Then, the quantum dots 51a to 51c, the oxide layer 52, the quantum dots 61a to 61c and the oxide layer 62 are patterned to predetermined dimensions by photolithography, and the principal surface of the substrate 1 is doped with boron (B) at a high concentration from the both sides of the quantum dots 51a to 51c, the oxide layer 52, the quantum dots 61a to 61c and the oxide layer 62, thereby forming the source electrode 2 and the drain electrode 3 (see the part (g) of FIG. 3).

Then, the side walls 7 and 8 are formed on the both sides of the quantum dots 51a to 51c, the oxide layer 52, the quantum dots 61a to 61c and the oxide layer 62, and the gate electrode 9 is formed on the charge storage layer 6 and the side walls 7 and 8 (see the part (h) of FIG. 3).

Then, $SiO_2$ is fabricated to cover the gate electrode 9, and the fabricated $SiO_2$ is patterned to predetermined dimensions by photolithography, thereby forming the $SiO_2$ layer 11. Then, the pad 12 is formed in contact with the $SiO_2$ layer 11 at a position above one end of the gate electrode 9, the pad 13 is formed in contact with the $SiO_2$ layer 11 at a position above the other end of the gate electrode 9, and the gate electrode 14 is formed on the $SiO_2$ layer 11 (see the part (i) of FIG. 3). Thus, the semiconductor device 10 is completed.

Figure 4:
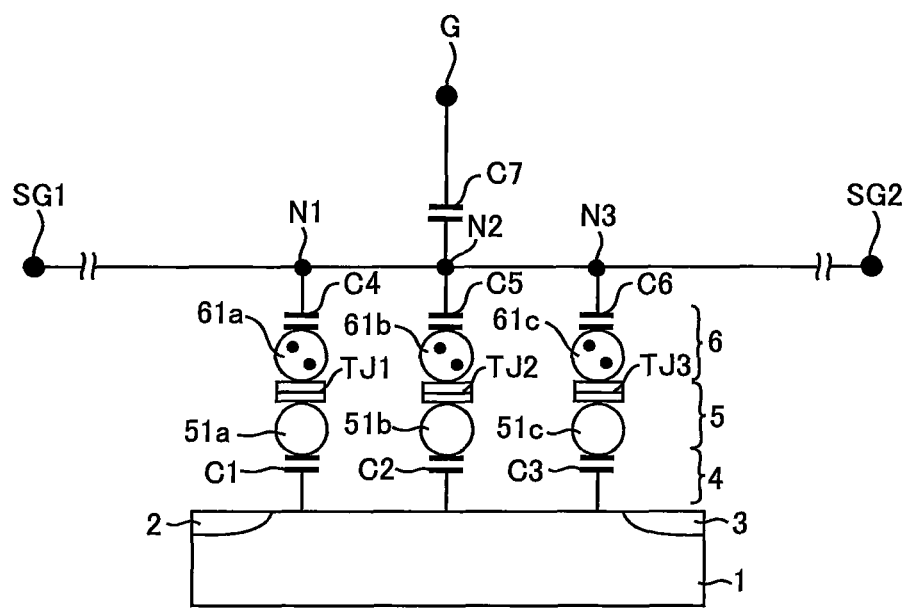
FIG. 4 is a schematic diagram showing an electrical circuit of the semiconductor device shown in FIG. 1.

FIG. 4 is a schematic diagram showing an electrical circuit of the semiconductor device 10 shown in FIG. 1. In FIG. 4, a signal gate SG1 represents the pad 12 capacitively coupled to one end of the gate electrode 9, a signal gate SG2 represents the pad 13 capacitively coupled to the other end of the gate electrode 9, and a gate G represents the gate electrode 14.

Referring to FIG. 4, since the $SiO_2$ layer 4 having a thickness that does not allow tunneling of carriers is interposed between the substrate 1 and the charge storage layer 5, the quantum dots 51a to 51c in the charge storage layer 5 are capacitively coupled to the substrate 1 by capacitors C1 to C3, respectively.

Since the oxide layer 52 of the charge storage layer 5 has a thickness that allows tunneling of carriers between the quantum dots 51a and 61a, between the quantum dots 51b and 61b and between the quantum dots 51c and 61c, the quantum dots 51a to 51c are coupled to the quantum dots 61a to 61c by tunnel junctions TJ1 to TJ3, respectively.

Since the oxide layer 62 of the charge storage layer 6 has a thickness that does not allow tunneling of carriers between the gate electrode 9 and the quantum dots 61a to 61c, the quantum dots 61a to 61c are capacitively coupled to nodes N1 to N3 in the gate electrode 9 by capacitors C4 to C6, respectively.

Since the $SiO_2$ layer 11 has a thickness that does not allow tunneling of carriers, the node N2 is capacitively coupled to the gate G by a capacitor C7.

Since the quantum dots 51a to 51c are made of undoped Si, and the quantum dots 61a to 61c are made of $n^+$-Si, when no voltage is applied to the nodes N1 to N3, the quantum dots 51a to 51c do not store carriers, and only the quantum dots 61a to 61c store carriers. In this case, each of the quantum dots 61a to 61c stores two electrons.

Figure 5:
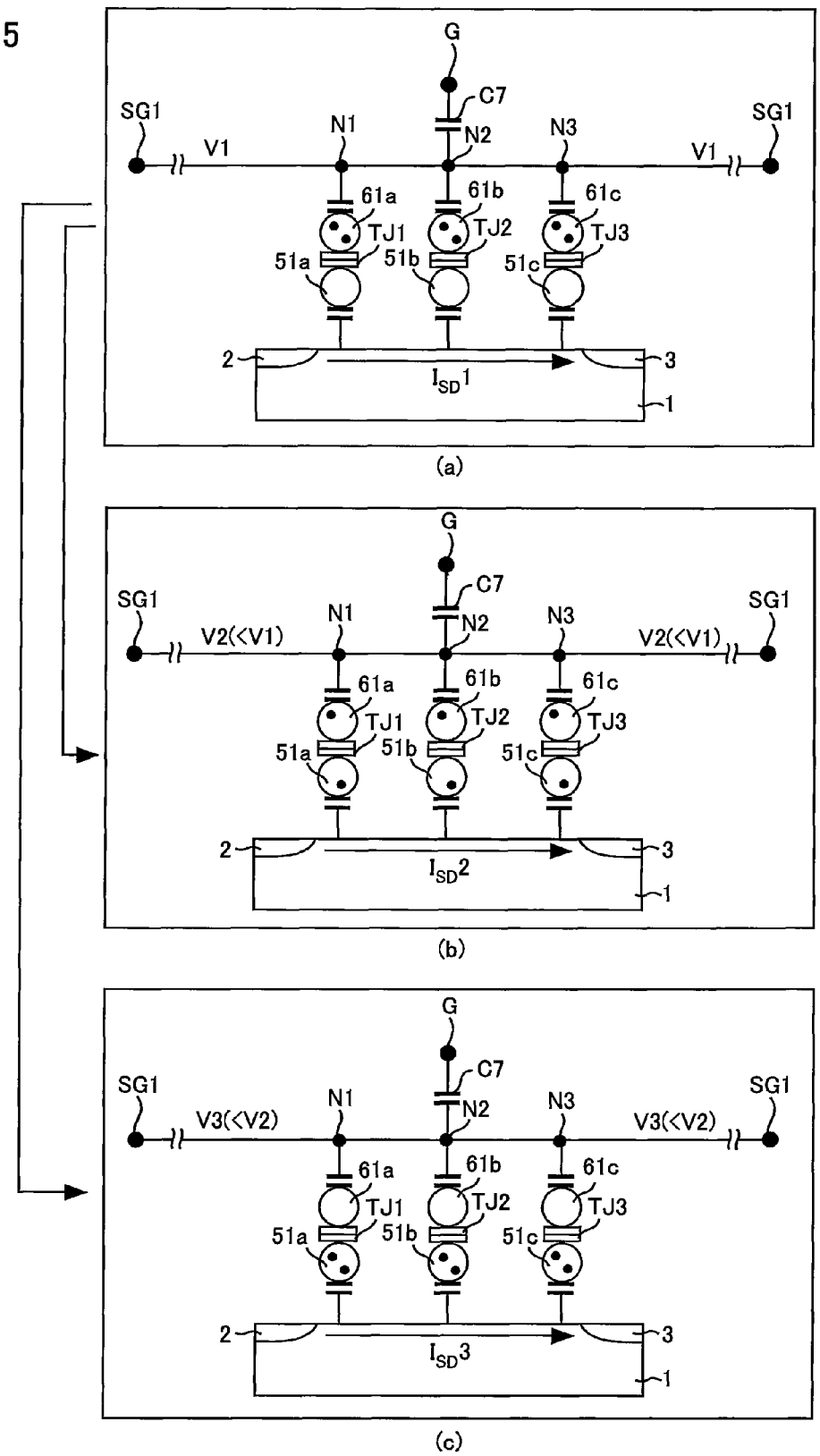
FIG. 5 is a diagram for illustrating an operation of the semiconductor device used as a semiconductor memory.

The semiconductor device 10 is used as a semiconductor memory or a comparator. First, a case where the semiconductor device 10 is used as a semiconductor memory will be described. FIG. 5 is a diagram for illustrating an operation of the semiconductor device 10 used as a semiconductor memory. In the case where the semiconductor device 10 is used as a semiconductor memory, the gate electrode 9 is composed of one signal gate SG1. In other words, an equal voltage is applied to the nodes N1 to N3.

When a voltage V1 is applied to the signal gates SG1 and SG2, the voltage V1 is applied to the nodes N1 to N3, and only the quantum dots 61a to 61c store carriers. In this case, a current $I_{SD}1$ flows between the source electrode 2 and the drain electrode 3 (see the part (a) of FIG. 5).

When a voltage V2 (<V1) is applied to the signal gates SG1 and SG2, the voltage V2 (<V1) is applied to the nodes N1 to N3, and some of the carriers stored in the quantum dots 61a to 61c migrate to the quantum dots 51a to 51c by tunneling. Thus, both the quantum dots 51a to 51c and the quantum dots 61a to 61c store carriers. In this case, a current $I_{SD}2$ (<$I_{SD}1$) flows between the source electrode 2 and the drain electrode 3 (see the part (b) of FIG. 5).

When a voltage V3 (<V2) is applied to the signal gates SG1 and SG2, the voltage V3 (<V2) is applied to the nodes N1 to N3, and the carriers stored in the quantum dots 61a to 61c further migrate to the quantum dots 51a to 51c by tunneling. Thus, only the quantum dots 51a to 51c store carriers. In this case, a current $I_{SD}3$ (<$I_{SD}2$) flows between the source electrode 2 and the drain electrode 3 (see the part (c) of FIG. 5).

Thus, the carrier distribution of the quantum dots 51a to 51c and 61a to 61c can be known by detecting the current $I_{SD}$ flowing between the source electrode 2 and the drain electrode 3. Therefore, if each carrier distribution is associated with a numeric value, the semiconductor device 10 can be used as a semiconductor memory.

In the case where the semiconductor device 10 is used as a semiconductor memory, for any of the numeric values associated with the carrier distributions, the carriers distributed on the quantum dots 51a to 51c and 61a to 61c are supplied from the quantum dots 61a to 61c, and therefore, the driving voltage of the semiconductor memory can be reduced. More specifically, in the case where the carriers distributed in the charge storage layers are supplied from the substrate or the gate electrode, the carriers have to be supplied to the charge storage layers via the capacitive coupling, and thus, a high driving voltage is required. However, in the case where the carriers distributed in the quantum dots 51a to 51c and 61a to 61c are supplied from one (the charge storage layer 6) of the stacked two charge storage layers 5 and 6, it is only necessary to maintain the carriers originally existing in the quantum dots 61a to 61c or to make the carriers on the quantum dots 61a to 61c migrate to the quantum dots 51a to 51c by tunneling. Therefore, the driving voltage can be reduced.

Next, a case where the semiconductor device 10 is used as a comparator will be described. FIGS. 6A to 6D are diagrams for illustrating an operation of the semiconductor device 10 used as a comparator. In the case where the semiconductor device 10 is used as a comparator, the gate electrode 9 is composed of two signal gates SG1 and SG2. The signal gate SG1 is disposed above the charge storage layers 5, 6 at a position on the left side of the quantum dots 51b and 61b, and the signal gate SG2 is disposed above the charge storage layers 5, 6 at a position on the right side of the quantum dots 51b and 61b.

When a voltage V1 corresponding to a logic value "1" is applied to both the signal gates SG1 and SG2, the nodes N1 to N3 have an equal potential, and only the quantum dots 61a to 61c store carriers. In this case, a current $I_{SD}1$ flows between the source electrode 2 and the drain electrode 3 (see FIG. 6A).

When the voltage V1 is applied to the signal gate SG1 and a voltage V3 (<V1) corresponding to a logic value "0" is applied to the signal gate SG2, the quantum dot 61a maintains the two electrons, one which is closer to the node N3 of the two electrons stored in the quantum dot 61b migrates to the quantum dot 51b by tunneling, and the two electrons stored in the quantum dot 61c migrate to the quantum dot 51c by tunneling. In short, the electrons located below the signal gate SG2 migrate from the quantum dots 61b, 61c to the quantum dots 51b, 51c. As a result, the quantum dots 61a and 51c store two electrons, the quantum dots 61b and 51b store one electron, and the quantum dots 51a and 61c store no electron. In this case, a current $I_{SD}4$ (<$I_{SD}1$) flows between the source electrode 2 and the drain electrode 3 (see FIG. 6B).

When the voltage V3 is applied to the signal gate SG1 and the voltage V1 is applied to the signal gate SG2, the two electrons stored in the quantum dot 61a migrate to the quantum dot 51a by tunneling, one which is closer to the node N1 of the two electrons stored in the quantum dot 61b migrates to the quantum dot 51b by tunneling, and the quantum dot 61c maintains the two electrons. In short, the electrons located below the signal gate SG1 migrate from the quantum dots 61a, 61b to the quantum dots 51a, 51b. As a result, the quantum dots 61c and 51a store two electrons, the quantum dots 61b and 51b store one electron, and the quantum dots 51c and 61a store no electron. In this case, a current $I_{SD}5$ (<$I_{SD}4$) flows between the source electrode 2 and the drain electrode 3 (see FIG. 6C).

When the voltage V3 is applied to the two signal gates SG1 and SG2, the two electrons stored in the quantum dots 61a to 61c migrate to the quantum dots 51a to 51c by tunneling. As a result, only the quantum dots 51a to 51c store electrons. In this case, a current $I_{SD}3$ (<$I_{SD}5$) flows between the source electrode 2 and the drain electrode 3 (see FIG. 6D).

Figure 6A:
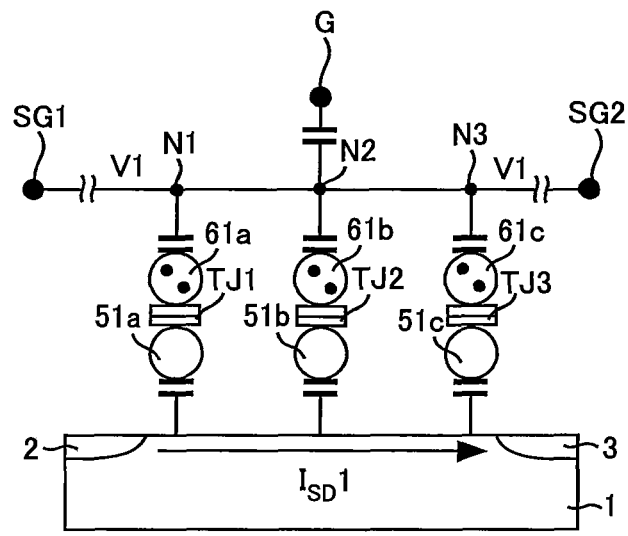
FIG. 6A is a diagram for illustrating an operation of the semiconductor device used as a comparator.

As described above, when the same voltage V1 is applied to the signal gate SG1 and the signal gate SG2, the quantum dots 51a to 51c and 61a to 61c have carrier distributions shown in FIG. 6A. When the voltage V1 applied to the signal gate SG1 is higher than the voltage V3 applied to the signal gate SG2, the quantum dots 51a to 51c and 61a to 61c have carrier distributions shown in FIG. 6B. When the voltage V3 applied to the signal gate SG1 is lower than the voltage V1 applied to the signal gate SG2, the quantum dots 51a to 51c and 61a to 61c have carrier distributions shown in FIG. 6C. When the same voltage V3 is applied to the signal gate SG1 and the signal gate SG2, the quantum dots 51a to 51c and 61a to 61c have carrier distributions shown in FIG. 6D.

When the carriers are distributed as shown in FIGS. 6A, 6B, 6C and 6D, the currents $I_{SD}1$, $I_{SD}4$, $I_{SD}5$ and $I_{SD}3$ flow, respectively. In other words, the current $I_{SD}$ flowing between the source electrode 2 and the drain electrode 3 varies with the magnitude relationship between the voltages applied to the two signals gates SG1 and SG2. Therefore, the magnitudes of the voltages applied to the two signal gates SG1 and SG2 can be compared by detecting the current $I_{SD}$ flowing between the source electrode 2 and the drain electrode 3. That is, the semiconductor device 10 can be used as a comparator.

In this case, the carriers simply migrate by tunneling between the quantum dots 51a and 61a, between the quantum dots 51b and 61b and between the quantum dots 51c and 61c according to the magnitude relationship between the voltages applied to the two signal gates SG1 and SG2, and therefore, the driving voltage of the comparator can be reduced.

When the voltages applied to the two signal gates SG1 and SG2 are expressed by digital values, the voltages applied to the two signal gates SG1 and SG2 and the current $I_{SD}$ are related to each other as shown in Table 1.

TABLE 1

| SG1 | SG2 | $I_{SD}$ |
|---|---|---|
| 1 | 1 | HIGH |
| 1 | 0 | MEDIUM |
| 0 | 1 | LOW |
| 0 | 0 | EXTREMELY LOW |

Figure 6B:
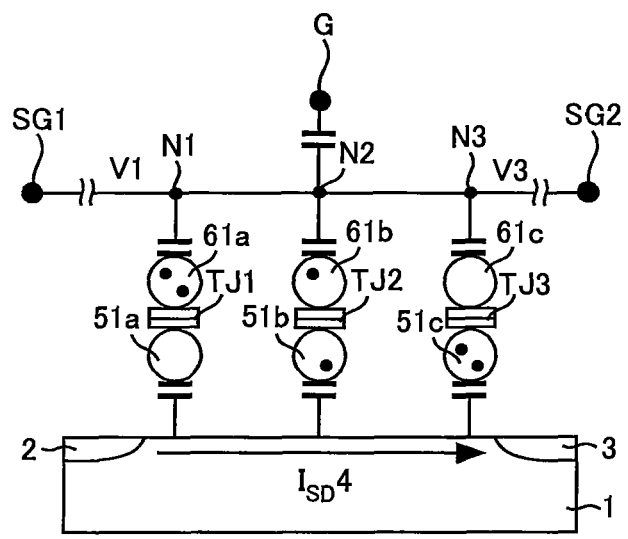
FIG. 6B is a diagram for illustrating the operation of the semiconductor device used as a comparator.
Figure 6C:
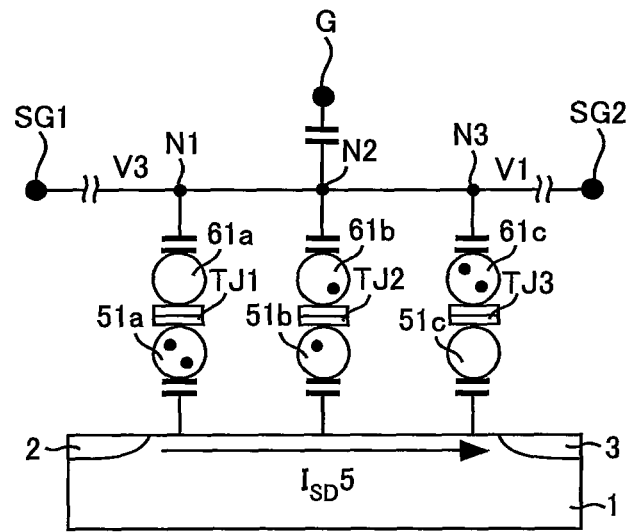
FIG. 6C is a diagram for illustrating the operation of the semiconductor device used as a comparator.
Figure 6D:
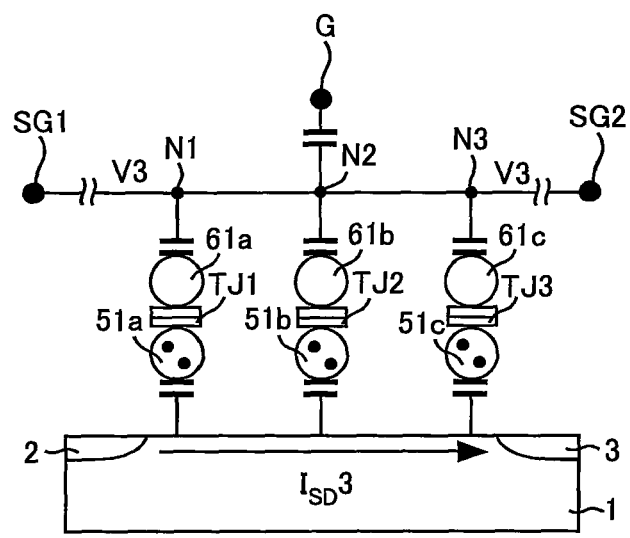
FIG. 6D is a diagram for illustrating the operation of the semiconductor device used as a comparator.

When SG1=SG2=1, the carriers in the quantum dots 51a to 51c and 61a to 61c are distributed as shown in FIG. 6A, and the current $I_{SD}$ flowing between the source electrode 2 and the drain electrode 3 is HIGH. When SG1=1 and SG2=0, the carriers in the quantum dots 51a to 51c and 61a to 61c are distributed as shown in FIG. 6B, and the current $I_{SD}$ is MEDIUM. When SG1=0 and SG2=1, the carriers in the quantum dots 51a to 51c and 61a to 61c are distributed as shown in FIG. 6C, and the current $I_{SD}$ is LOW. When SG1=SG2=0, the carriers in the quantum dots 51a to 51c and 61a to 61c are distributed as shown in FIG. 6D, and the current $I_{SD}$ is EXTREMELY LOW.

Therefore, also in the case where the voltages applied to the two signal gates SG1 and SG2 assume digital values, the semiconductor device 10 can be used as a comparator by detecting the current $I_{SD}$ flowing between the source electrode 2 and the drain electrode 3.

Note that the potentials of the quantum dots 51a to 51c and 61a to 61c are discrete, and therefore, the comparator based on the quantum dots 51a to 51c and 61a to 61c is suitable for comparison of digital signals.

Figure 7:
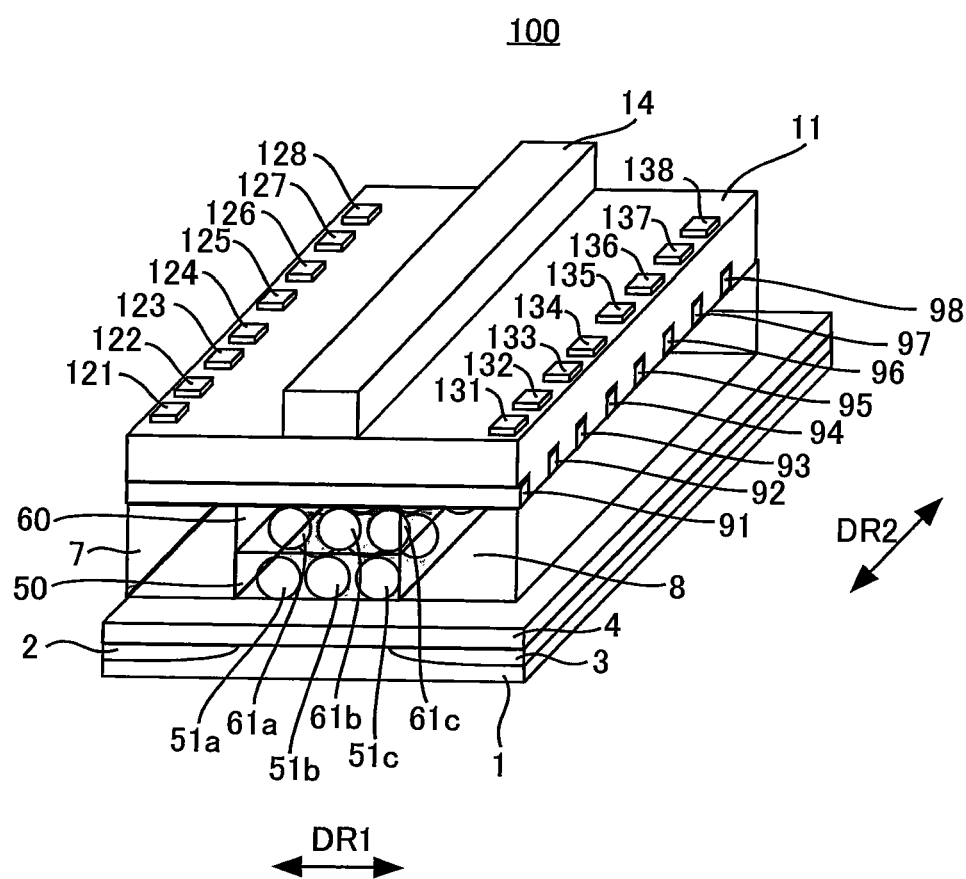
FIG. 7 is a perspective view of another comparator to which the semiconductor device shown in FIG. 1 is applied.

FIG. 7 is a perspective view of another comparator to which the semiconductor device 10 shown in FIG. 1 is applied. Referring to FIG. 7, a comparator 100 is the same as the semiconductor device 10 except that the charge storage layers 5 and 6 of the semiconductor device 10 are replaced with charge storage layers 50 and 60, respectively, the gate electrode 9 is replaced with gate electrodes 91 to 98, and the pads 12 and 13 are replaced with pads 121 to 128 and pads 131 to 138, respectively.

The charge storage layer 50 is formed on the $SiO_2$ layer 4 in contact with the $SiO_2$ layer 4 and comprises the quantum dots 51a to 51c and the oxide layer 52. In the charge storage layer 50, the quantum dots 51a to 51c are arranged in a lateral direction DR1 of the comparator 100, and a plurality of sets of quantum dots 51a and 51c are arranged in a longitudinal direction DR2 of the comparator 100.

The charge storage layer 60 is formed on the charge storage layer 50 in contact with the charge storage layer 50 and comprises the quantum dots 61a to 61c and the oxide layer 62. In the charge storage layer 60, the quantum dots 61a to 61c are arranged in the lateral direction DR1, and a plurality of sets of quantum dots 61a and 61c are arranged in the longitudinal direction DR2.

In this case, the quantum dots 51a to 51c and 61a to 61c are arranged by the distance of 5 nm in the longitudinal direction DR2, for example.

The plurality of gate electrodes 91 to 98 are formed on the side walls 7 and 8 and the charge storage layer 60 in contact with the side walls 7 and 8 and the charge storage layer 60 and are arranged in the longitudinal direction DR2 at predetermined intervals. More specifically, each of the gate electrodes 91 to 98 is disposed on a set of quantum dots 61a to 61c and quantum dots 51a to 51c arranged in the normal direction of the substrate 1. Each of the plurality of gate electrodes 91 to 98 is made of the same material as the gate electrode 9 and has a semicylindrical semicircle or inverted trapezoidal cross section. Each of the plurality of gate electrodes 91 to 98 has a line width of 20 nm or more and a thickness of 10 nm or more. The distance between adjacent two gate electrodes 91 and 92, 92 and 93, 93 and 94, 94 and 95, 95 and 96, 96 and 97 and 97 and 98 is 20 nm or more in half pitch. As a result, two or more sets of quantum dots 51a to 51c and 61a to 61c are arranged along the width of one gate electrode (any of the gate electrodes 91 to 98).

The gate electrodes 91 to 98 are formed by depositing a metal silicide or the like on the side walls 7 and 8 and the charge storage layer 60 and patterning the deposited metal silicide by photolithography.

The pads 121 to 128 are formed in contact with the $SiO_2$ layer 11 and arranged in the longitudinal direction DR2 in such a manner that the pads 121 to 128 are located above one end of the gate electrodes 91 to 98, respectively. The pads 131 to 138 are formed in contact with the $SiO_2$ layer 11 and arranged in the longitudinal direction DR2 in such a manner that the pads 131 to 138 are located above the other end of the gate electrodes 91 to 98, respectively. The pads 121 to 128 are capacitively coupled to the one end of the gate electrodes 91 to 98, respectively, and the pads 131 to 138 are capacitively coupled to the other end of the gate electrodes 91 to 98, respectively.

In the comparator 100, the $SiO_2$ layer 11 is formed to cover the plurality of gate electrodes 91 to 98.

When voltages VA and VB are applied to the pads 121 and 131, respectively, the voltages VA and VB are applied to the gate electrode 91 through the pads 121 and 131 because of the capacitive coupling, the carriers in the quantum dots 61a to 61c and 51a to 51c disposed below the gate electrode 91 are distributed as shown in any of FIGS. 6A to 6D according to the magnitude relationship between the voltages VA and VB.

The same holds true for the cases where the voltages VA and VB are applied to the pads 122 and 132, 123 and 133, 124 and 134, 125 and 135, 126 and 136, 127 and 137, and 128 and 138.

The current $I_{SD}$ flowing between the source electrode 2 and the drain electrode 3 varies with the carrier distribution of the quantum dots 61a to 61c and 51a to 51c disposed below the gate electrodes 91 to 98.

Therefore, the comparator 100 can compare a voltage pattern VPA, which is a pattern of voltages applied through the eight pads 121 to 128, with a voltage pattern VPB, which is a pattern of voltages applied through the eight pads 131 to 138, by measuring the current $I_{SD}$. That is, when the voltage patterns VPA and VPB are simultaneously applied to the pads 121 to 128 and the pads 131 to 138, respectively, an output ($=I_{SD}$) determined by the pattern similarity (hamming distance) can be obtained.

As described above, the comparator 100 can be used as a multi-bit parallel comparator.

The comparator 100 can be used to perform a stochastic association operation described below. On the assumption that the voltage pattern VPB is stored pattern data, and the voltage pattern VPA is an input pattern, if the HIGH or EXTREMELY LOW current $I_{SD}$ is detected when the voltage patterns VPA and VPB are simultaneously applied to the pads 121 to 128 and the pads 131 to 138, respectively, the stored pattern (the voltage pattern VPB) similar to the input pattern (the voltage pattern VPA) can be selected.

In the above description, the comparator 100 has the eight gate electrodes 91 to 98. However, the present invention is not limited thereto, and the comparator 100 can have n (n represents an integer equal to or more than 2) gate electrodes.

As described above, according to the present invention, the semiconductor device 10 is used as a semiconductor memory or comparator by causing migration by tunneling of the carriers (electrons) originally existing in the charge storage layer 6 (or 60) into the charge storage layer 5 (or 50) according to the voltage applied to the gate electrode 9 (or gate electrodes 91 to 98) to distribute the carriers (electrons) in the charge storage layer 5 and/or charge storage layer 6 (or the charge storage layer 50 and/or charge storage layer 60) and measuring the current $I_{SD}$ that varies with the distribution of the carriers (electrons) in the charge storage layers 5 and 6 (or the charge storage layers 50 and 60).

Therefore, the driving voltage can be reduced compared with the semiconductor device that introduces carriers into the floating gate from the outside (an electrode or substrate).

In the above description, the charge storage layer 5 has the quantum dots 51a to 51c made of undoped Si, and the charge storage layer 6 has the quantum dots 61a to 61c made of n⁺-Si. However, the present invention is not limited thereto, and the charge storage layer 6 may have quantum dots made of p⁺-Si, while the charge storage layer 5 still has the quantum dots 51a to 51c made of undoped Si. In this case, the dot density of the quantum dots made of p⁺-Si ranges from $5\times10^{10}$ cm$^{-2}$ to $1\times10^{13}$ cm$^{-2}$, and the carrier concentration ranges from 1 to 100 carriers per dot.

Furthermore, the charge storage layer 6 may have quantum dots made of n⁺-Si having a carrier density $N1_e$, and the charge storage layer 5 may have quantum dots made of n-type Si having a carrier density $N2_e$ ($<N1_e$).

Furthermore, the charge storage layer 6 may have quantum dots made of p⁺-Si having a carrier density $N1_h$, and the charge storage layer 5 may have quantum dots made of p-type Si having a carrier density $N2_h$ ($<N1_h$).

Furthermore, in the above description, the semiconductor device 10 has two charge storage layers 5 and 6 stacked on one another. However, according to the present invention, the semiconductor device 10 may have three or more charge storage layers. In general, the semiconductor device 10 can have m (m represents an integer equal to or more than 2) charge storage layers. In this case, the number of charge storage layers stacked on one another can be determined based on the number of digits of the numeric value stored in the semiconductor device 10.

In the present invention, the charge storage layer 6 or 60 constitutes a "first charge storage layer", and the charge storage layer 5 or 50 constitutes a "second charge storage layer".

Furthermore, in the present invention, the quantum dots 61a to 61c constitute "first quantum dots", and the quantum dots 51a to 51c constitute "second quantum dots".

Furthermore, in the present invention, the oxide layer 52 constitutes an "insulating layer" that provides tunnel junction between the quantum dots 61a to 61c and the quantum dots 51a to 51c.

Furthermore, in the present invention, the source electrode 2 and the drain electrode 3 constitute a "detecting section" that detects the result of comparison between the first and second voltages applied to the first and second charge storage layers 5 and 6 (or charge storage layers 50 and 60) via the gate electrode 9 (or gate electrodes 91 to 98) in the form of the current that is determined by the carrier distribution of the first quantum dots 61a to 61c and the second quantum dots 51a to 51c.

The embodiment disclosed herein is for illustrative purposes in all respects and should not be construed to limit the scope of the present invention. The scope of the present invention is not defined by the above description of the embodiment but by the claims described later and includes all modifications of the embodiment within the scope and meaning equivalent to those of the claims.

INDUSTRIAL APPLICABILITY

The present invention is applied to a semiconductor device that has a floating gate structure and can reduce the driving voltage.

The invention claimed is:

1. A semiconductor device configured to operate as a field effect transistor having a floating gate, the semiconductor device comprising:
    a first charge storage layer comprising a first set of quantum dots;
    a second charge storage layer comprising a second set of quantum dots, wherein the second set of quantum dots is doped such that it has a higher carrier concentration than the first set of quantum dots;
    a gate electrode configured to apply a voltage to the first charge storage layer and to the second charge storage layer;
    a first signal gate; and
    a second signal gate, wherein the first signal gate and the second signal gate are configured to set the semiconductor device to function as a first device or as a second device;
    wherein the gate electrode, the first signal gate, and the second signal gate are capacitively coupled to the first set of quantum dots;
    wherein the first charge storage layer has a first thickness configured to allow tunneling of carriers between the first set of quantum dots and the second set of quantum dots; and
    wherein the second charge storage layer has a second thickness configured to prevent tunneling of carriers between the gate and the second set of quantum dots.

2. The semiconductor device according to claim 1, further comprising an insulating layer between the first set of quantum dots and the second set of quantum dots, wherein the insulating layer provides a tunnel junction between the first set of quantum dots and the second set of quantum dots, wherein the gate electrode is formed on the first charge storage layer in such a manner that the gate electrode is capacitively coupled to the first set of quantum dots.

3. The semiconductor device according to claim 2, wherein the first set of quantum dots are made of a semiconductor material with a p-type or n-type conductive type, and wherein the second set of quantum dots are made of a semiconductor material with an intrinsic conductive type.

4. The semiconductor device according to claim 2, wherein the first set of quantum dots comprises n-type silicon, and wherein the second set of quantum dots comprises undoped silicon.

5. The semiconductor device according to claim 2, further comprising:
    a detecting section configured to detect the result of a comparison between first and second voltages applied to the first and second charge storage layers via the gate electrode in the form of a current that flows according to carrier distribution of the first and second sets of quantum dots,
    wherein the first signal gate is configured to apply the first voltage to the first and second charge storage layers;
    wherein the second signal gate is configured to apply the second voltage, to be compared with the first voltage, to the first and second charge storage layers, wherein the first and second sets of quantum dots have carriers that are distributed according to the comparison results between the first and second voltages.

6. The semiconductor device according to claim 5, wherein distribution of a majority of the carriers in the first set of quantum dots represents a first logic level, and wherein distribution of the majority of the carriers in the second set of quantum dots represents a second logic level.

7. The semiconductor device according to claim 5, further comprising:
    a dielectric layer configured to provide capacitive coupling between the gate electrode and the first set of quantum dots,
    wherein the first signal gate is formed in contact with the dielectric layer at a position on one side of the center of a substrate on which the first and second charge storage layers are stacked in an in-plane direction of the substrate, wherein the second signal gate is formed in contact with the dielectric layer at a position on the other side of the center of the substrate in the in-plane direction of the substrate, and wherein the carriers are distributed in the first set of quantum dots formed below the first signal gate and the second quantum dots formed below the second signal gate when the first voltage represents a first logic level and the second voltage represents a second logic level, and wherein the carriers are distributed in the second set of quantum dots formed below the first signal gate and the first set of quantum dots formed below the second signal gate when the first voltage represents the second logic level and the second voltage represents the first logic level.

8. The semiconductor device according to claim 6, wherein the first and second charge storage layers and the gate electrode are disposed on a channel region formed in one principal surface of a substrate, and wherein the detecting section is configured to detect the result of comparison between the first and second voltages in the form of a current that flows between a source and a drain of the field effect transistor.

9. The semiconductor device according to claim 8, wherein the detecting section is configured to:

detect a first current when the first and second voltages represent the first logic level, detect a second current lower than the first current when the first voltage represents the first logic level and the second voltage represents the second logic level, detect a third current lower than the second current when the first voltage represents the second logic level and the second voltage represents the first logic level, and detect a fourth current lower than the third current when the first and second voltages represent the second logic level.

10. The semiconductor device of claim 1, wherein the second set of quantum dots is doped such that it has a higher carrier concentration than the first set of quantum dots when no external voltage is applied to the first charge storage layer and the second charge storage layer.

11. The semiconductor device of claim 1, wherein the first device is a memory device, and wherein the second device is a comparator.

12. The semiconductor device of claim 1, wherein the first set of quantum dots is coupled to the second set of quantum dots via a plurality of tunnel junctions.

13. The semiconductor device of claim 1, wherein the first thickness of the first charge storage layer is between about one and about three nanometers, and wherein the second thickness of the second charge storage layer is between about three nanometers and about six nanometers.

14. The semiconductor device of claim 1, wherein the first and second sets of quantum dots comprise quantum dots having a size such that injection of one carrier into the respective quantum dot increases the electrostatic energy of the respective quantum dot by an amount greater than 26 millielectron volts.

15. The semiconductor device of claim 1, wherein the first and second sets of quantum dots comprise quantum dots having a dot density of between $5 \times 10^{10}$ centimeters$^{-2}$ and $1 \times 10^{13}$ centimeters$^{-2}$.

16. The semiconductor device of claim 1, wherein a carrier concentration with the first and second sets of quantum dots is between 1 and 100 carriers per quantum dot.

17. A method of operating a semiconductor device as a field effect transistor having a floating gate, the method comprising:

applying a first voltage to a first signal gate of the semiconductor device;

applying a second voltage to a second signal gate of the semiconductor device;

wherein the semiconductor device comprises:

a first charge storage layer comprising a first set of quantum dots;

a second charge storage layer comprising a second set of quantum dots, wherein the second set of quantum dots is doped such that it has a higher carrier concentration than the first set of quantum dots;

wherein the first signal gate and the second signal gate are capacitively coupled to at least one of the first set of quantum dots or the second set of quantum dots;

wherein the first charge storage layer has a first thickness configured to allow tunneling of carriers between the first set of quantum dots and the second set of quantum dots; and wherein the second charge storage layer has a second thickness configured to prevent tunneling of carriers between the gate and the second set of quantum dots; and wherein the application of the first and second voltages to the first and second signal gates, respectively, affects a distribution of carriers between the first set of quantum dots and the second set of quantum dots such that:

application to the first and second signal gates of an equal voltage at a first level causes a majority of the carriers to be distributed in the second set of quantum dots;

application to the first and second signal gates of an equal voltage at a second level greater than the first level but less than a third level causes the carriers to be substantially evenly distributed between the first set of quantum dots and the second set of quantum dots; and application to the first and second signal gates of an equal voltage at the third level causes the majority of the carriers to be distributed in the first set of quantum dots.

18. The method of claim 17, wherein application to the first signal gate of a first voltage and application to the second signal gate of a second voltage greater than the first voltage causes a greater portion of the carriers nearer the first signal gate to migrate from the first set of quantum dots to the second set of quantum dots.

19. The method of claim 18, wherein the semiconductor device is configured to operate as a memory device and as a comparator.

20. A method of manufacturing a semiconductor device configured to operate as a field effect transistor having a floating gate, the method comprising:

oxidizing a surface of a substrate;

forming a first set of quantum dots on the substrate;

oxidizing the first set of quantum dots to form a first oxide layer about the first set of quantum dots;

forming a second set of quantum dots on the first oxide layer, wherein the second set of quantum dots is doped such that it has a higher carrier concentration than the first set of quantum dots, and wherein the first oxide layer has a thickness configured to allow tunneling of carriers between the first set of quantum dots and the second set of quantum dots;

forming a second oxide layer about the second set of quantum dots;

forming sidewalls on sides of the first and second oxide layers;

forming a gate electrode on the second oxide layer, wherein the second oxide layer has a thickness configured to prevent tunneling of carriers between the gate electrode and the second set of quantum dots;

forming a silicon dioxide layer on the gate electrode; and forming a first signal gate and a second signal gate on respective sides of the silicon dioxide layer, wherein the first signal gate and the second signal gate are configured to receive voltages causing the semiconductor device to function as a memory device or a comparator.

* * * * *

UNITED STATES PATENT AND TRADEMARK OFFICE
CERTIFICATE OF CORRECTION

| | | |
|---|---|---|
| PATENT NO. | : 8,653,518 B2 | Page 1 of 1 |
| APPLICATION NO. | : 12/599638 | |
| DATED | : February 18, 2014 | |
| INVENTOR(S) | : Makihara et al. | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 575 days.

Signed and Sealed this
Second Day of June, 2015

Michelle K. Lee
*Director of the United States Patent and Trademark Office*